United States Patent
Jeng et al.

(10) Patent No.: US 7,294,541 B2
(45) Date of Patent: Nov. 13, 2007

(54) METHOD OF FABRICATING GATE DIELECTRIC LAYER AND METHOD OF FABRICATING SEMICONDUCTOR DEVICE

(75) Inventors: Li-Shian Jeng, Taitung (TW); Tung-Hsing Lee, Taitung (TW); Tzyy-Ming Cheng, Hsinchu (TW); Tzermin Shen, Hsinchu (TW); Da-Ching Cho, Chiayi (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/163,470

(22) Filed: Oct. 20, 2005

(65) Prior Publication Data

US 2007/0093011 A1   Apr. 26, 2007

(51) Int. Cl.
H01L 21/336 (2006.01)
H01L 21/8234 (2006.01)

(52) U.S. Cl. .................................. 438/197; 257/324
(58) Field of Classification Search ................ 438/197, 438/299, 303, 486, 510, 680; 257/324, 325, 257/327, 410
See application file for complete search history.

(56) References Cited

U.S. PATENT DOCUMENTS

| | | | | |
|---|---|---|---|---|
| 6,077,737 A | * | 6/2000 | Yang et al. | 438/240 |
| 6,159,812 A | * | 12/2000 | Cheek et al. | 438/303 |
| 7,115,959 B2 | * | 10/2006 | Andreoni et al. | 257/410 |
| 2005/0032386 A1 | * | 2/2005 | Chang et al. | 438/712 |

* cited by examiner

Primary Examiner—Phuc T. Dang
(74) Attorney, Agent, or Firm—Jianq Chyun IP Office

(57) ABSTRACT

A method of fabricating a gate dielectric layer is described. First, a well is produced in a substrate. Later, the substrate is cleaned. Then the substrate is processed by a pre-annealed process. Afterwards, a gate dielectric layer is formed on the substrate. As a result, the on-current of the semiconductor device can be increased.

20 Claims, 8 Drawing Sheets

METHOD OF FABRICATING GATE DIELECTRIC LAYER AND METHOD OF FABRICATING SEMICONDUCTOR DEVICE

BACKGROUND OF THE INVENTION

1. Field of Invention

The present invention is relating to a method of fabricating of gate dielectric layer and semiconductor device. In particular, it is relating to a method of fabricating gate dielectric layer and semiconductor device capable of improving the semiconductor device operating efficiency.

2. Description of Related Art

The conventional technology of fabricating method for gate dielectric layer of metal oxide semiconductor device includes using ion implantation for forming a well inside a substrate. Afterwards, a rapid thermal annealing process is performed on the substrate to compensate for the lattice defects created during ion implantation. Then a cleaning process is conducted. The gate dielectric layer is then formed on top of the substrate.

Because the rapid thermal annealing process is conducted prior to the cleaning process without the removing of the primary oxide layer; it has poorer compensation effectiveness for lattice defect, thus the subsequent quality for gate dielectric layer formed on top of the substrate is reduced.

In addition, during the semiconductor device fabricating process, the device activity is increasing continuously, and at the same time, the gate width is becoming smaller. In the case of the shrinking gate width, the use of conventional technology and method for making gate dielectric layer is unable to increase the on-current for the semiconductor device.

SUMMARY OF THE INVENTION

As can be seen, the objective for the present invention is to provide a method of fabricating a gate dielectric layer for increasing the on-current of the semiconductor device.

Another objective the present invention is to provide a method of fabricating a semiconductor device for improving semiconductor device operating efficiency.

The present invention presents a method of fabricating a gate dielectric layer; first a well is produced inside the substrate. Then the substrate undergoes a cleaning process. Later, a pre-annealed process is done to the substrate, and a layer of gate dielectric layer is disposed on the substrate.

According to an embodiment of the present invention for the method of fabricating of the aforementioned gate dielectric layer, the pre-annealed process is conducted under inert gas.

According to an embodiment of the present invention for the method of fabricating of aforementioned gate dielectric layer, the inert gas includes nitrogen.

According to an embodiment of the present invention for the method of fabricating of the aforementioned gate dielectric layer, the operating temperature for the pre-annealed process is between 900° C. to 1300° C.

According to an embodiment of the present invention for the method of fabricating of the aforementioned gate dielectric layer, the operating duration for the pre-annealed process is between 15 seconds to 200 seconds.

According to an embodiment of the present invention, the method of fabricating of the aforementioned gate dielectric layer, its forming method includes thermal oxidation.

According to an embodiment of the present invention, the method of fabricating of the aforementioned gate dielectric layer, the method of formation for the well includes ion implantation.

According to an embodiment of the present invention, the method of fabricating of the aforementioned gate dielectric layer, after the formation of the well and prior to the cleaning process, further includes a thermal treatment.

According to an embodiment of the present invention in the method of fabricating of the aforementioned gate dielectric layer, the thermal treatment includes the rapid thermal annealing process.

According to an embodiment of the present invention in the method of fabricating of the aforementioned gate dielectric layer, the cleaning process includes the using of hydrofluoric acid dilution for cleaning.

The present invention presents a method of fabricating of a semiconductor device. A well is first formed in the substrate. And then a cleaning process is conducted to the substrate. Later, a pre-annealed process is conducted to the substrate and a layer of gate dielectric layer is disposed on top of the substrate. Afterwards, a gate is disposed on the gate dielectric layer on the side wall of the gate forming a pair of gap walls. Later, at the substrate located at both sides of the gap walls, a source/drain region is disposed.

According to an embodiment of the present invention in the method of fabricating for the aforementioned semiconductor device, the source/drain region forming method includes ion implantation.

Based on the aforementioned method of fabricating gate dielectric layer and semiconductor device presented in the present invention, a pre-annealed process is conducted to effectively increase the on-current of the semiconductor device. Furthermore, the present invention uses the cleaning process to remove the primary oxide layer and the pre-annealed process can effectively compensate for lattice defect. Therefore, gate oxide layers containing improved quality are produced, and can increase the operating efficiency for the semiconductor device.

To easily understand the characteristics, advantages, and other purposes of the present invention as mentioned above and elsewhere, the following presents several embodiments of the present invention, in conjunction with the attached figures, for further elaboration in details below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENT

Figure 1:
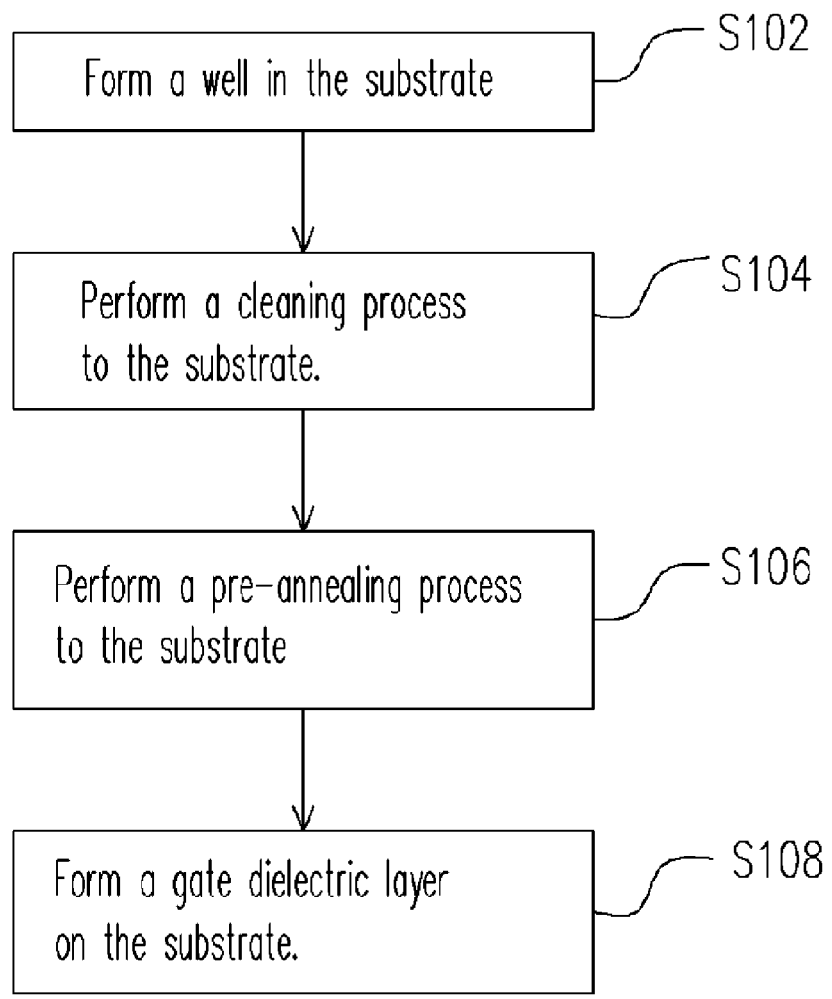
FIG. 1 is a flowchart diagram, schematically illustrating the fabrication of a gate dielectric layer, according to an embodiment of the present invention.

FIG. 1 is a flowchart, schematically illustrating the fabrication of a gate dielectric layer according to the present invention.

First, a well (S102) is produced in the substrate. Later, a cleaning process (S104) is conducted to the substrate. Then a pre-annealed process (S106) is done to the substrate. Finally, a layer of gate dielectric layer (S108) is disposed on top of the substrate.

Corresponding to the gate dielectric layer produced in the aforementioned method, the removal of a primary oxide layer by the cleaning process and the conducting of the pre-annealed process can effectively compensate for the lattice defects created during ion implantation. As a result, the gate oxide layer contains improved quality, and can effectively increase the on-current for the semiconductor device.

FIG. 2A to FIG. 2D are cross-sectional flowcharts, schematically illustrating the fabrication for a semiconductor device, according to an embodiment of the present invention.

Figure 2A:
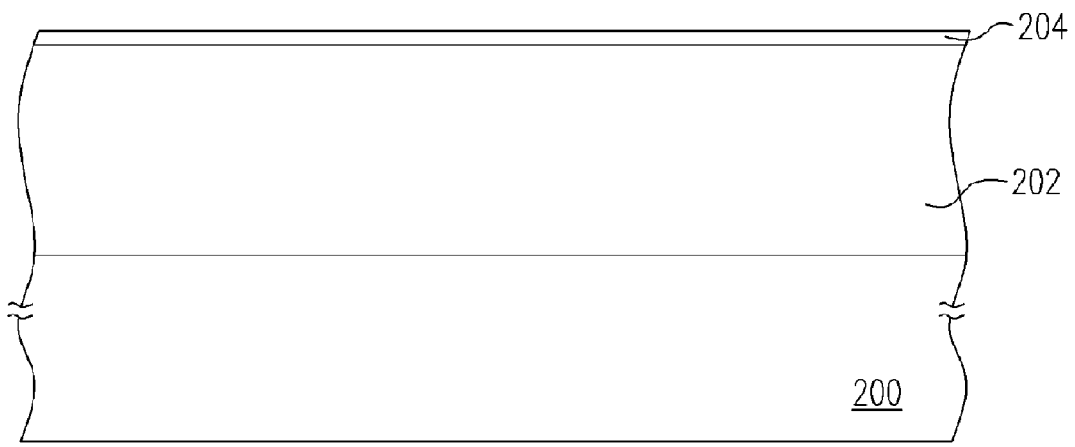
FIG. 2A to FIG. 2D are the cross-sectional flowcharts, schematically illustrating the fabrication of a semiconductor device, according to an embodiment of the present invention.

Referring to FIG. 2A, the semiconductor device presented in the present invention, is using a NMOS transistor as an example. First, a semiconductor substrate 200, for example, (1,0,0) silicon substrate is provided. Then a well 202, such as a p-type well, is produced in the semiconductor substrate 200. An example of a method for forming the well 202 is by using Boron as a dopant for the ion implantation process. Furthermore, in another embodiment of the present invention, after the well 200 is produced, a thermal treatment such as a rapid thermal annealing process is conducted to compensate for the lattice defect on the semiconductor substrate 200 due to ion implantation.

Afterwards, a cleaning process for the semiconductor substrate 200 is conducted using hydrofluoric acid dilution to remove the primary oxide layer on top of the semiconductor substrate 200 surface (not illustrated).

Afterwards, a pre-annealed process is conducted to the semiconductor substrate 200 under inert gas, which can be, for example, nitrogen. During the pre-annealed process, the operating temperature is, for example, between 900° C. to 1300° C. The preferred operating temperature range is between 1000° C. to 1150° C. Its operating duration is, for example, between 15 seconds to 200 seconds.

Later, a layer of gate dielectric layer 204 is disposed on top of the semiconductor substrate 200 having, for example, material including silicon oxide and method of forming including thermal oxidation.

In the aforementioned method of formation of gate dielectric layer 204, a pre-annealed process is conducted to compensate for the lattice defect during ion implantation. The formed gate oxide layer 204 has superior quality, and can effectively increase the on-current for the semiconductor device.

Figure 2B:
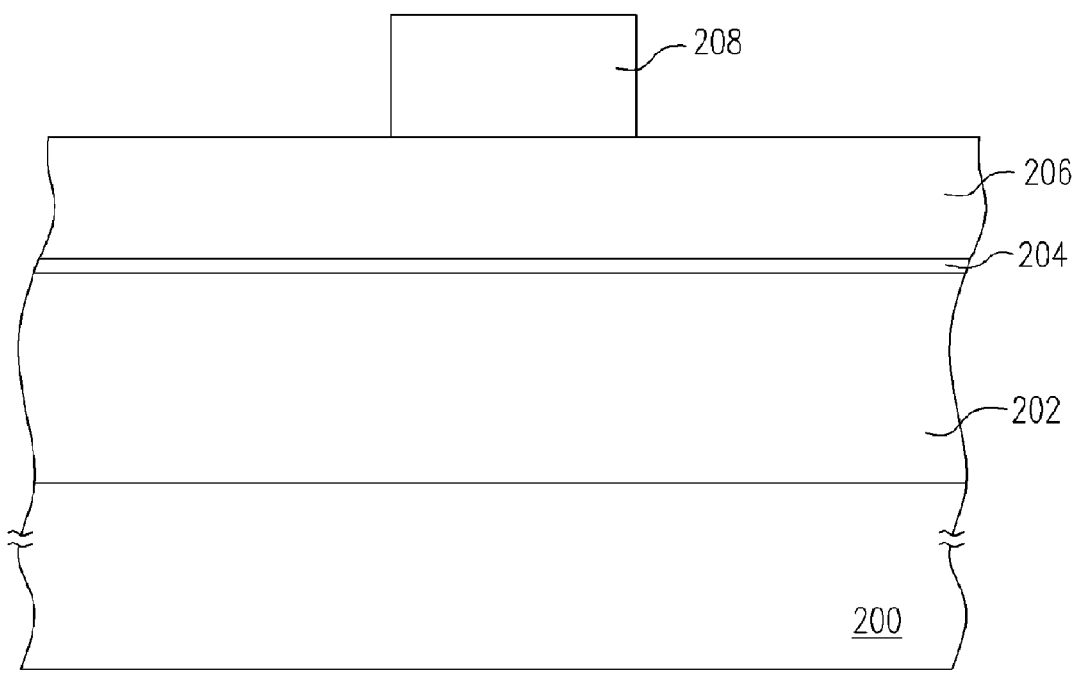

Later, referring to FIG. 2B, a layer of conductive layer 206 is disposed on the semiconductor substrate 200, which, for example, has material using doped polycrystalline silicon and formation method using In-situ doping method, such as chemical vapor deposition. Thereafter, a patterned photoresist layer 208 is disposed on the conductive layer 206.

Figure 2C:
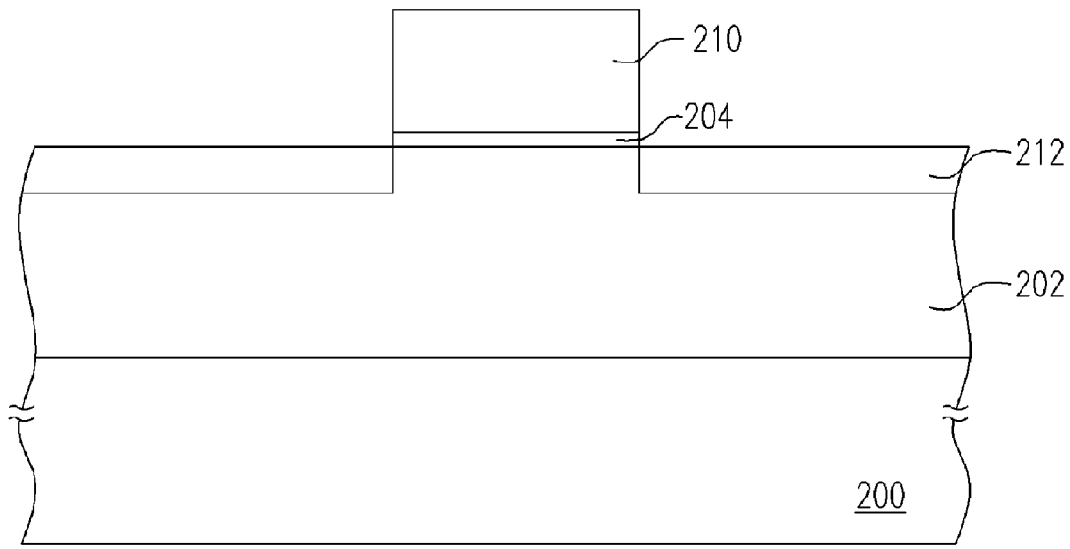

Moreover, referring to FIG. 2C, using the patterned photoresist layer 208 as a mask, an etching process is conducted for removing parts of conductive layer 206 for forming the gate 210 and removing parts of the gate dielectric layer 204.

Furthermore, a doped region 212 is disposed on the semiconductor substrate 200 at both sides of the gate 210, in which its conductivity type is of n-type. The formation method is, for example, uses phosphorus as a dopant in an ion implantation process for restraining the short channel effect. Later, the removal of the patterned photoresist layer 208 is conducted.

Figure 2D:
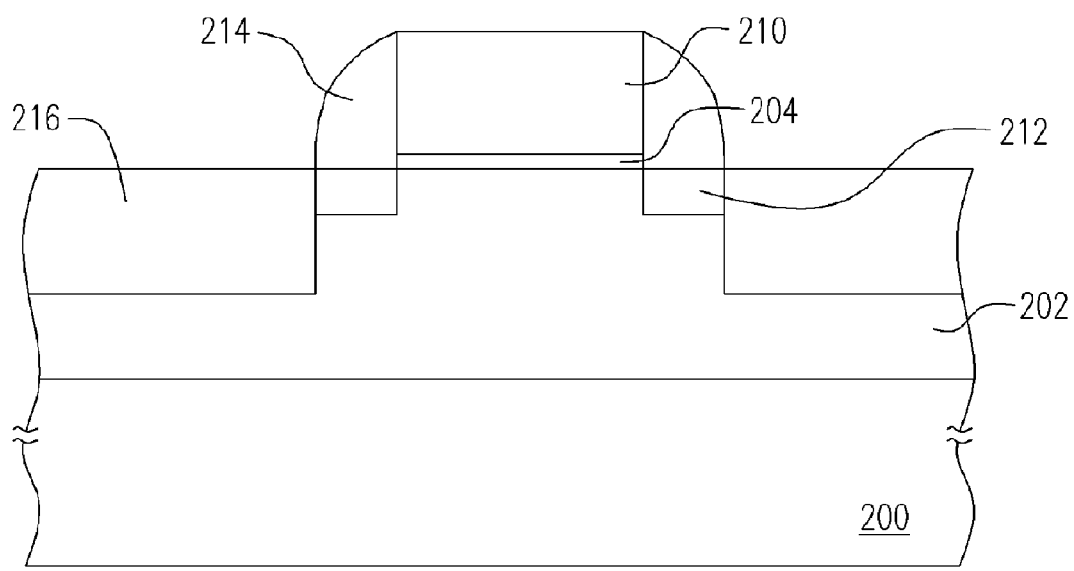

Thereafter, referring to FIG. 2D, the gate 210 side wall forming a gap wall 214, having material, for example, silicon oxide. Afterwards, a source/drain region 216 having n-type conductivity is produced on the semiconductor substrate 200 located on both sides of the gap walls 214. Its formation method is an ion implantation process which uses, for example, phosphorous as a dopant. Furthermore, a rapid thermal annealing process is conducted to the semiconductor substrate 200 for making the silicon lattice located on top of the semiconductor substrate 200 to rearrange in proper order to compensate for the lattice defect during the ion implantation process.

In the method of fabricating the semiconductor device presented in the present invention, because of the forming of better quality gate dielectric layer 204, the operating efficiency for the semiconductor device can be effectively increased.

Although the aforementioned embodiment of the present invention is using NMOS transistor as an example, but is not limit to only this type of semiconductor device. Therefore, it will be apparent to those skilled in the art that various modifications and variations can be made to the structure of the present invention without departing from the scope or spirit of it, in view of the aforementioned embodiments, the present invention can be used in PMOS transistor and CMOS transistor and other variations of semiconductor devices.

The following is a description of the method of fabricating a NMOS device for a semiconductor device according to the present invention. The results are obtained from experimental testing, in which the control variables are pre-annealed duration and gate width.

Figure 3:
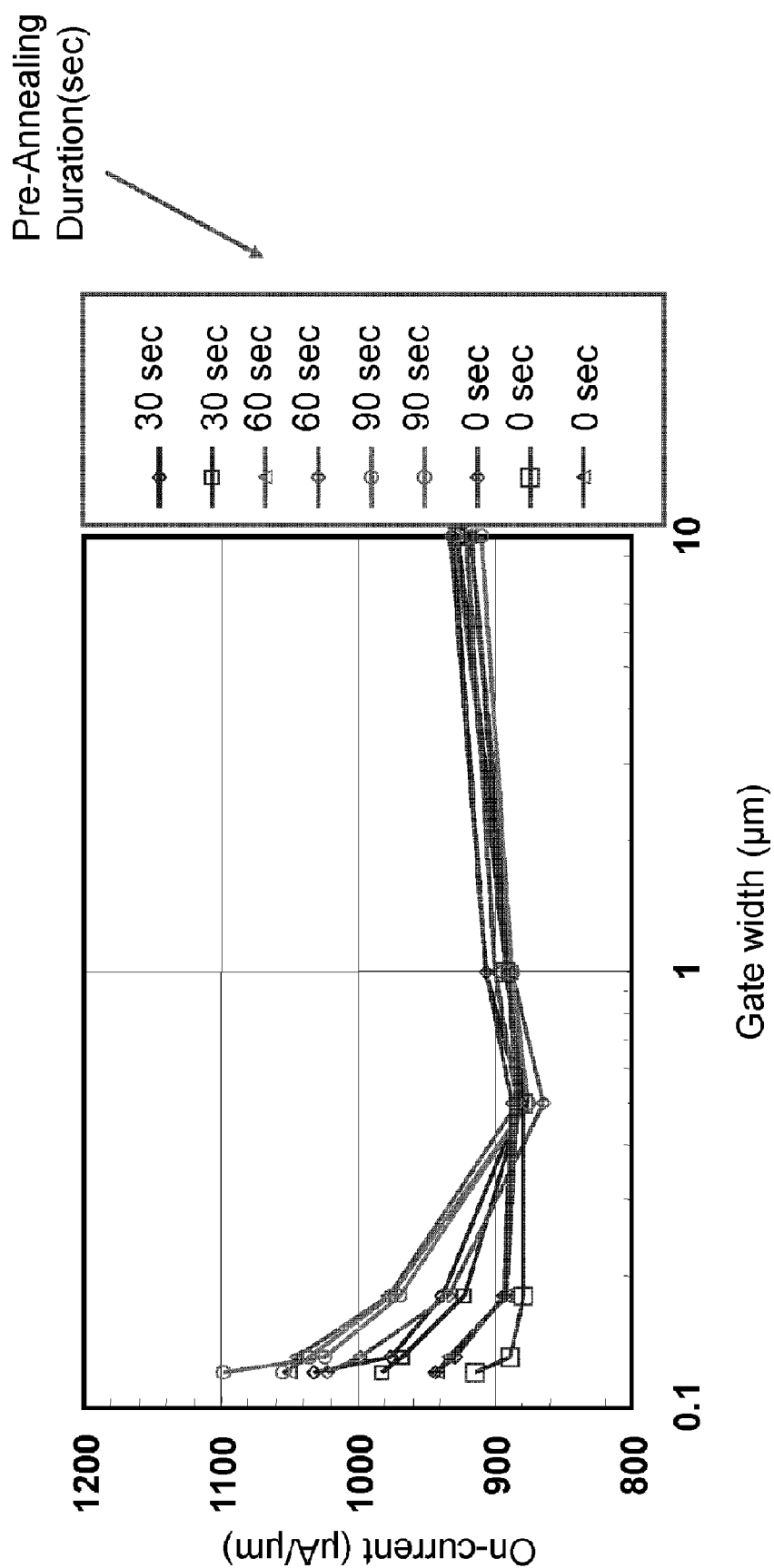
FIG. 3 is a relationship diagram, schematically illustrating the relationship between the gate width and on-current.

FIG. 3 is a relationship diagram to show the relationship between gate width and on-current. Referring to FIG. 3, when the gate width is 10 μm, the pre-annealed process has negligible effect on the on-current of the semiconductor device. However, as the gate width is gradually shrinking, especially nearing 0.1 μm, the on-current for the semiconductor device after pre-annealed process is clearly larger than that without the pre-annealed process.

In addition, one can discover that the on-current after the 90 seconds pre-annealed process is larger than for that for the 30 seconds pre-annealed process for the semiconductor device. It is noticed that at narrower gate width, the longer the duration for the pre-annealed process, the larger the semiconductor device on-current.

Figure 4:
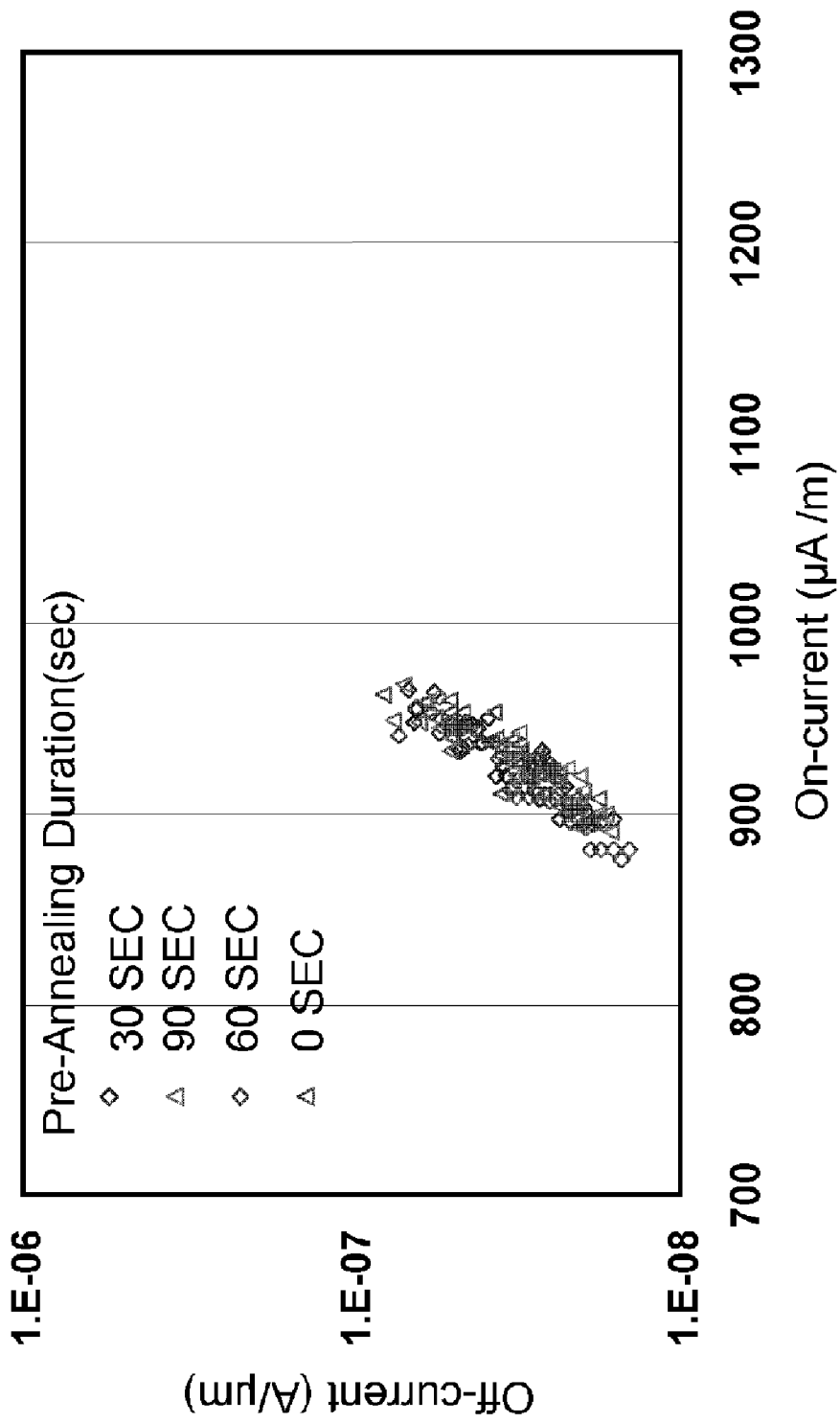
FIG. 4 is a relationship diagram, schematically illustrating the relationship between the off-current and on-current at gate widths of 10 μm and 0.08 μm.
Figure 5:
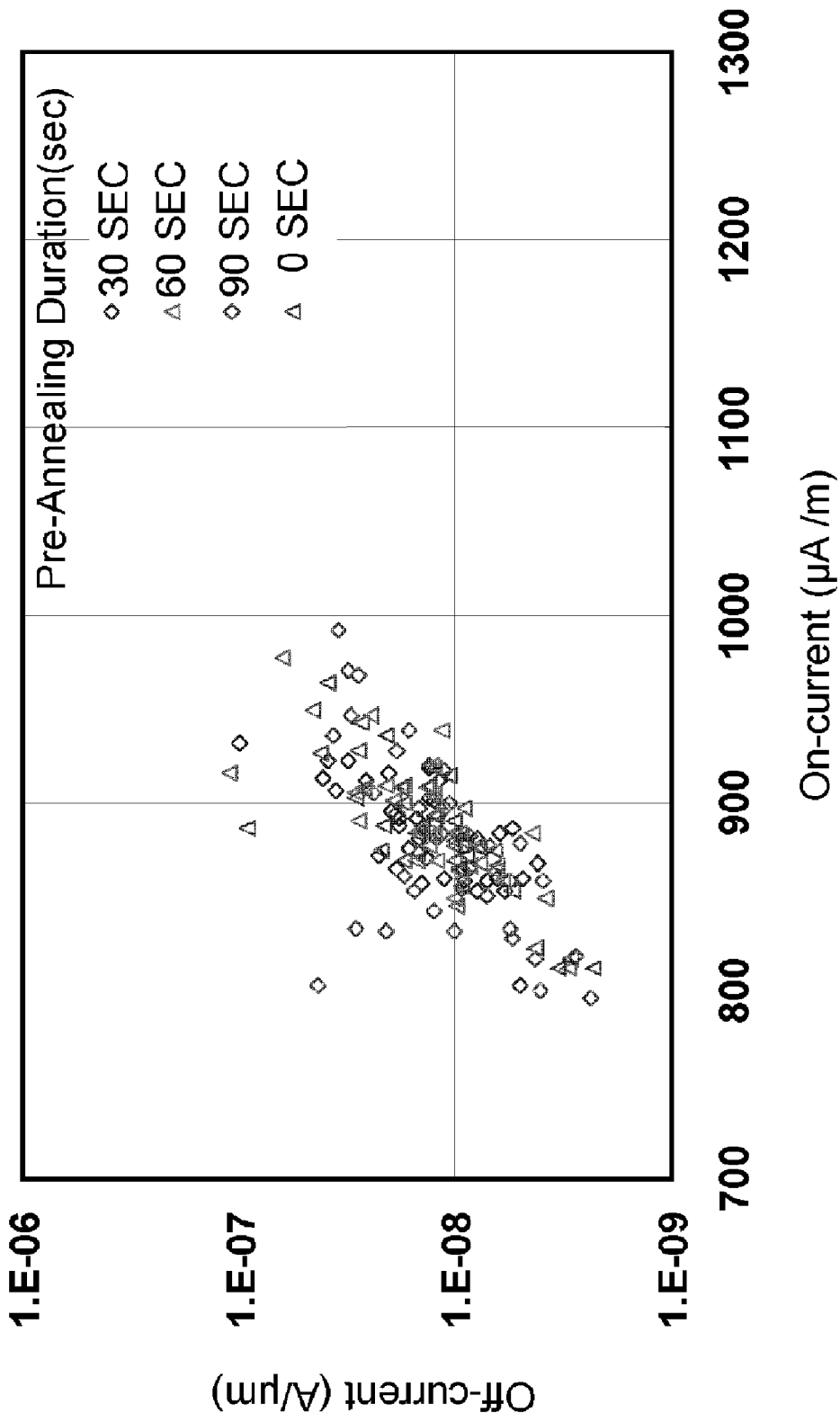
FIG. 5 is a relationship diagram, schematically illustrating the relationship between the off-current and on-current at gate widths of 0.5 μm and 0.08 μm.
Figure 6:
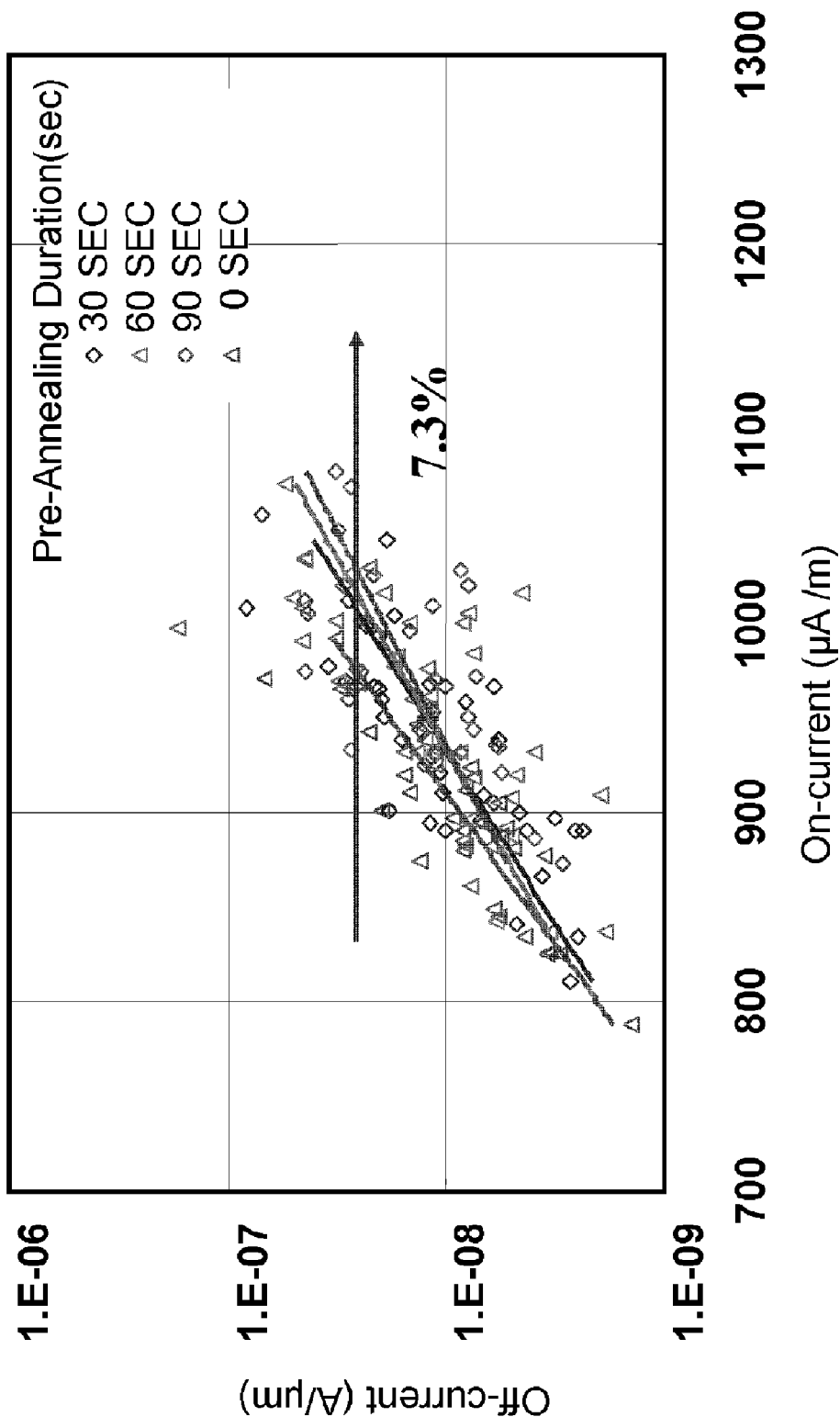
FIG. 6 is a relationship diagram, schematically illustrating the relationship between the off-current and on-current at gate widths of 0.2 μm and 0.08 μm.
Figure 7:
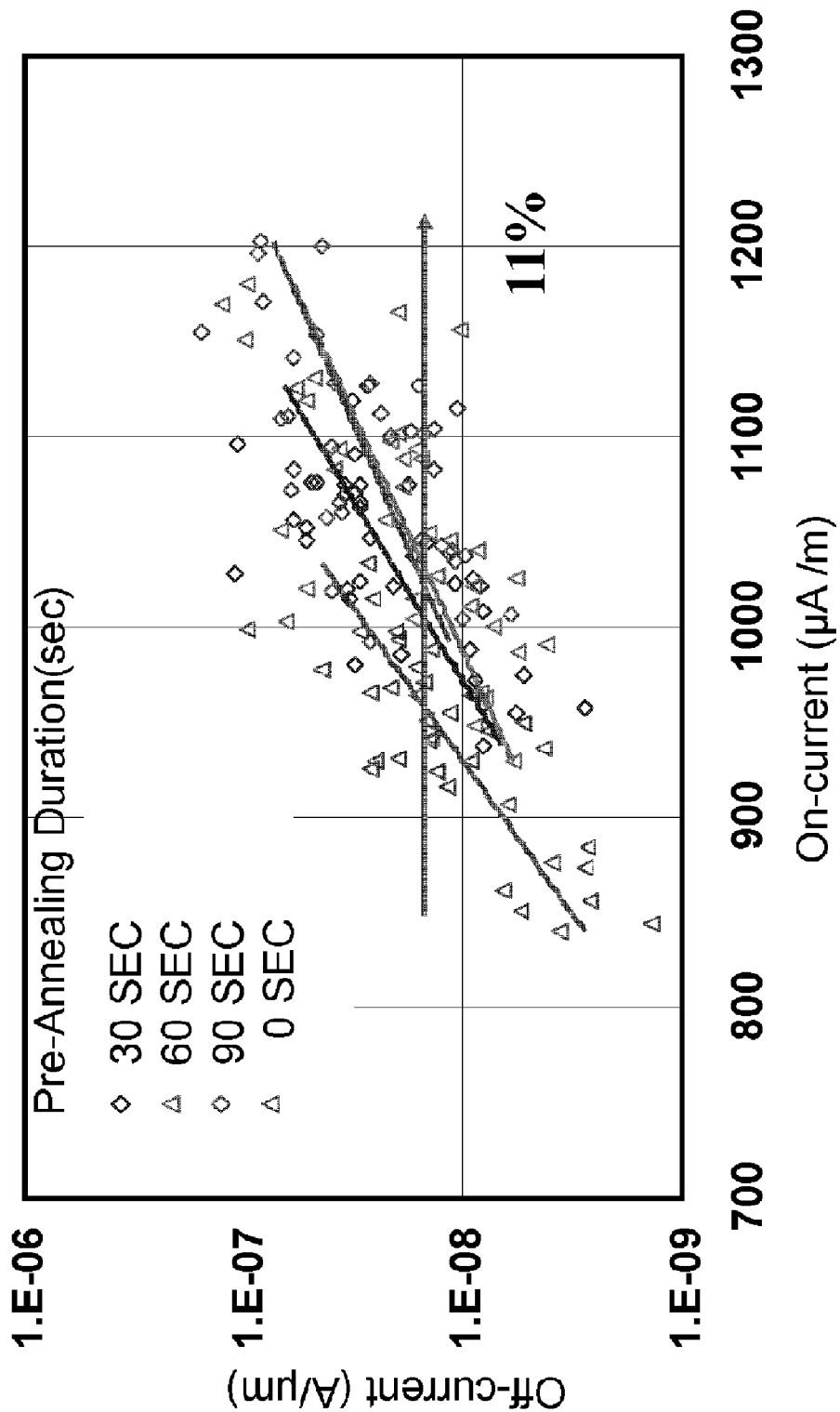
FIG. 7 is a relationship diagram, schematically illustrating the relationship between the off-current and on-current at gate widths of 0.12 μm and 0.08 μm.

FIG. 4 is a relationship diagram, schematically illustrating the relationship between off-current and on-current at gate widths of 10 µm and 0.08 µm. FIG. 5 is a relationship diagram, schematically illustrating the relationship between off-current and on-current at gate widths of 0.5 µm and 0.08 µm. FIG. 6 is a relationship diagram, schematically illustrating the relationship between off-current and on-current at gate widths of 0.2 µm and 0.08 µm. FIG. 7 is a relationship diagram, schematically illustrating the relationship between off-current and on-current at gate widths of 0.12 µm and 0.08 µm.

First, referring to FIG. 4, at gate width of 10 µm, one can find that as the gate width is widen, the pre-annealed process has negligible effect on the semiconductor device on-current.

However, as can be seen in FIG. 5 to FIG. 7, as the gate width gradually shrinks, one can clearly see that the on-current for the semiconductor device undergoing the pre-annealed process is larger than that for the semiconductor device without the pre-annealed process. In particularly as the gate width is reduced to 0.20 µm (Referring to FIG. 6) and 0.12 µm (Referring to FIG. 7), the semiconductor device undergoing the 90 seconds pre-annealed process in comparison to that without the pre-annealed process has increased by 7.3% and 11% respectively.

To sum up the aforementioned results, the present invention at least includes the following advantages.

1. In the method of fabricating the gate dielectric layer in the present invention, because of a pre-annealed process, the on-current for the semiconductor device can be effectively increased.

2. In the method of fabricating the gate dielectric layer in the present invention, the longer the duration of the pre-annealed process, the larger the effect of increase in on-current.

3. The method of fabricating of the semiconductor device as presented in the present invention includes a cleaning process and a pre-annealed process, which leads to better quality gate dielectric layer for effectively increasing the operating efficiency for the semiconductor device.

Although a better example has been mentioned above to explain this invention, it does not limit to this invention. It will be apparent to those skilled in the art that various modifications and variations can be made to the structure of the present invention without departing from the scope or spirit of it. In view of the foregoing, it is intended that the present invention cover modifications and variations of this invention provided they fall within the scope of the following claims and their equivalents.

What is claimed is:

1. A method of fabricating a gate dielectric layer, comprising:
    forming a well in a substrate;
    conducting a cleaning process to the substrate;
    conducting a pre-annealed process to the substrate; and
    after conducting the pre-annealed process, forming the gate dielectric layer on the substrate.

2. The method of fabricating the gate dielectric layer in claim 1, wherein the pre-annealed process is conducted under an inert gas.

3. The method of fabricating the gate dielectric layer in claim 2, wherein the inert gas includes nitrogen.

4. The method of fabricating the gate dielectric layer in claim 1, wherein an operating temperature for the pre-annealed process is between 900° C. to 1300° C.

5. The method of fabricating the gate dielectric layer in claim 1, wherein an operating duration for the pre-annealed process is between 15 seconds to 200 seconds.

6. The method of fabricating the gate dielectric layer in claim 1, wherein a gate dielectric layer forming method includes thermal oxidation.

7. The method of fabricating the gate dielectric layer in claim 1, wherein a well forming method includes ion implantation.

8. The method of fabricating the gate dielectric layer in claim 1, wherein after the formation of the well prior to the cleaning process, further comprising a thermal treatment.

9. The method of fabricating the gate dielectric layer in claim 8, wherein the thermal treatment comprises a rapid thermal annealing process.

10. The method of fabricating the gate dielectric layer in claim 1, wherein the cleaning process includes using a hydrofluoric acid dilution.

11. A method of fabricating a semiconductor device, comprising:
    forming a well in a substrate;
    conducting a cleaning process to the substrate;
    conducting a pre-annealed process to the substrate;
    after conducting the pre-annealed process, forming a gate dielectric layer on the substrate;
    forming a gate on the gate dielectric layer;
    forming a gap wall on the side wall of the gate; and
    forming a source/drain region at the semiconductor substrate located on both sides of the gap walls.

12. The method of fabricating the semiconductor device in claim 11, wherein the pre-annealed process is under an inert gas.

13. The method of fabricating the semiconductor device in claim 12,
    wherein the inert gas includes nitrogen.

14. The method of fabricating the semiconductor device in claim 11, wherein an operating temperature for the pre-annealed process is between 900° C. to 1300° C.

15. The method of fabricating the semiconductor device in claim 11, wherein an operating duration for the pre-annealed process is between 15 seconds to 200 seconds.

16. The method of fabricating the semiconductor device in claim 11, wherein a gate dielectric layer forming method includes thermal oxidation.

17. The method of fabricating the semiconductor device in claim 11, wherein a well forming method includes ion implantation.

18. The method of fabricating the semiconductor device in claim 11, wherein after the forming of the well prior to the cleaning process, further comprises a thermal treatment.

19. The method of fabricating the semiconductor device in claim 11, wherein the cleaning process includes using a hydrofluoric acid dilution.

20. The method of fabricating the semiconductor device in claim 11, wherein a source/drain region forming method comprises ion implantation.

* * * * *